(12) United States Patent
Ugge (10) Patent No.: US 9,786,838 B2
(45) Date of Patent: Oct. 10, 2017

(54) PACKAGES FOR INTEGRATED CIRCUITS AND METHODS OF PACKAGING INTEGRATED CIRCUITS

(71) Applicant: Everspin Technologies, Inc., Chandler, AZ (US)

(72) Inventor: Angelo V. Ugge, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/290,849

(22) Filed: Oct. 11, 2016

(65) Prior Publication Data

US 2017/0104149 A1 Apr. 13, 2017

Related U.S. Application Data

(60) Provisional application No. 62/240,565, filed on Oct. 13, 2015.

(51) Int. Cl.
| | |
|---|---|
| *H01L 43/02* | (2006.01) |
| *H01L 27/22* | (2006.01) |
| *H01L 43/08* | (2006.01) |
| *H01L 43/12* | (2006.01) |

(52) U.S. Cl.
CPC ............. *H01L 43/02* (2013.01); *H01L 27/222* (2013.01); *H01L 43/08* (2013.01); *H01L 43/12* (2013.01)

(58) Field of Classification Search
CPC ......... H01L 43/02; H01L 43/12; H01L 43/08; H01L 27/222
See application file for complete search history.

(56) References Cited

U.S. PATENT DOCUMENTS

| | | | | |
|---|---|---|---|---|
| 5,679,975 A | * | 10/1997 | Wyland | ................ H01L 23/552 257/659 |
| 2015/0243881 A1 | * | 8/2015 | Sankman | ............... H01L 23/295 361/679.55 |

* cited by examiner

*Primary Examiner* — David Vu
(74) *Attorney, Agent, or Firm* — Bookoff McAndrews, PLLC (57) ABSTRACT

An integrated circuit package including an integrated circuit die including a first side and a second side opposite the first side, the first side including at least one magnetoresistive device formed thereon. The integrated circuit package also may include a first magnetic shield disposed on or adjacent the first side of the integrated circuit die, wherein the first magnetic shield is formed of a composite material.

25 Claims, 7 Drawing Sheets

PACKAGES FOR INTEGRATED CIRCUITS AND METHODS OF PACKAGING INTEGRATED CIRCUITS

CROSS-REFERENCE TO RELATED APPLICATIONS

This application claims the benefits of priority from U.S. Provisional Application No. 62/240,565, filed on Oct. 13, 2015, which is incorporated by reference herein in its entirety.

TECHNICAL FIELD

The present disclosure relates to packages for, and methods of packaging, integrated circuit devices.

INTRODUCTION

An integrated circuit (IC) device includes a set of electronic circuits formed on a substrate of semiconductor material. Typically, one or more IC devices are housed in an IC package. The IC package provides mechanical and electrical support for the IC devices packaged therein. In general, among other functions, the IC package provides physical protection, thermal control, power supply, electromagnetic interference (EMI) shielding, and interconnection between the IC devices and the next level of assembly (e.g., motherboard, etc.). A large number of IC package types exist in industry. Non-limiting examples of package types include through-hole packages (e.g., single in-line package (SIP), dual in-line package (DIP), etc.) and surface mount packages (e.g., pin grid array (PGA), ball grid array (BGA), lead frame based packages, etc.).

Any type of IC device (e.g., microprocessors, memory devices, etc.) may be packaged in an IC package. In some applications (such as, e.g., magnetoresistive random access memory (MRAM)), the package may also shield the included device from external magnetic fields. MRAM is a non-volatile computer memory technology that uses magnetic charges to store data. External magnetic fields (e.g., produced by cell phones, electrical transmission lines, disk drives, TVs, etc.) may interfere with the performance of an MRAM. Therefore, packages for MRAM devices may include magnetic shielding layers that reduces the effect of the external magnetic fields. Typically, in such IC packages, a metallic shield in the form of a sheet or a foil is provided adjacent to the IC device to act as a shielding layer.

BRIEF DESCRIPTION OF THE DRAWINGS

The accompanying drawings, which are incorporated in and constitute a part of this specification, illustrate exemplary embodiments of the present disclosure. In these drawings, where appropriate, reference numerals illustrating like or similar elements are labeled similarly. For simplicity and clarity of illustration, the figures depict the general structure and/or manner of construction of the various embodiments. Descriptions and details of well-known features (e.g., interconnects, etc.) and techniques may be omitted to avoid unnecessarily obscuring other features. Elements in the figures are not necessarily drawn to scale. The dimensions of some features may be exaggerated relative to other features to improve understanding of the exemplary embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Further, even if it is not specifically mentioned in the text, aspects described with reference to one embodiment may also be applicable to, and may be used with, other embodiments.

DETAILED DESCRIPTION

In the discussion that follows, relative terms such as "about," "substantially," "approximately," etc. are used to indicate a possible variation of ±10% in a stated numeric value. It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, as alluded to above, the term "exemplary" is used in the sense of example or "illustrative," rather than "ideal." The terms "comprise," "include," "have," "with," and any variations thereof are used synonymously to denote or describe a non-exclusive inclusion. As such, a process, method, article, or apparatus that uses such terms does not include only those steps, structure or elements but may include other steps, structures or elements not expressly listed or inherent to such process, method, article, or apparatus. Further, the terms "first," "second," and the like, herein do not denote any order, quantity, or importance, but rather are used to distinguish one element from another. Similarly, terms of relative orientation, such as "front side, "top side," "back side," "bottom side," etc. are referenced relative to the described figures. Moreover, the terms "a" and "an" herein do not denote a limitation of quantity, but rather denote the presence of at least one of the referenced item.

Embodiments of the present disclosure relate to, among other things, packaging of an IC device. There are many embodiments described and illustrated herein, as well as many variations of those embodiments. In one aspect, the current disclosure is directed to methods and processes for packaging an IC die, and methods to manufacture a package for an IC die. The package may include a magnetic shield including one or more magnetically conductive compounds—for example, compounds including nickel (Ni) and/or iron (Fe) (and/or alloys thereof). In one embodiment, the magnetic shield may include a composite material having a conductive compound that includes nickel (Ni), for example, about 80%. In another embodiment, the conductive compound, in lieu of the nickel (Ni) or in addition thereto, includes iron (Fe), for example, about 15%. In yet another embodiment, the conductive compound also includes molybdenum (Mo), for example, about 5%. In another aspect, the current disclosure is directed to conductive compound packages for an IC die that provide shielding of the die from external electromagnetic fields. The one or more conductive compounds described and/or illustrated herein may be employed to form a first magnetic shield for at least first portion of the IC die (which may, for example, correspond to a top magnetic shield) and/or a second magnetic shield for at least a second portion of the die (which may, for example, correspond to a bottom magnetic shield). Each of the embodiments disclosed herein may include one or more of the features described in connection with any of the other disclosed embodiments.

Figure 1A:
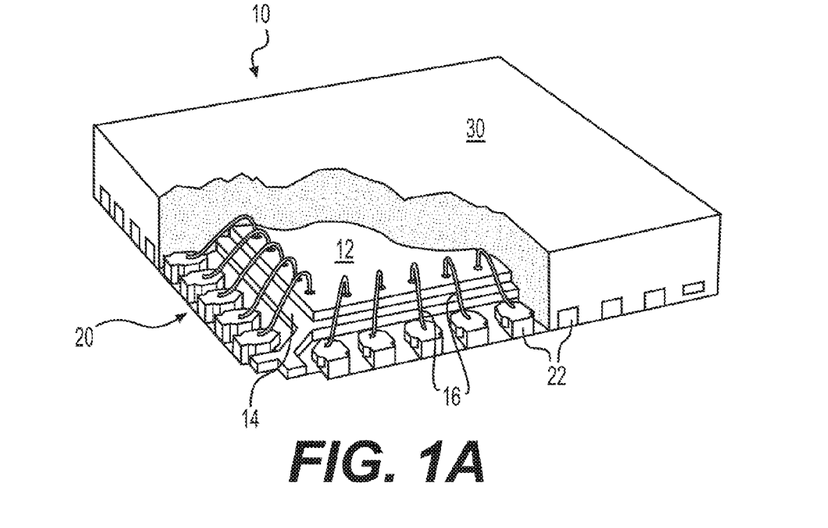
FIG. 1A illustrates a cut-away view of an exemplary IC package of the current disclosure.
Figure 1B:
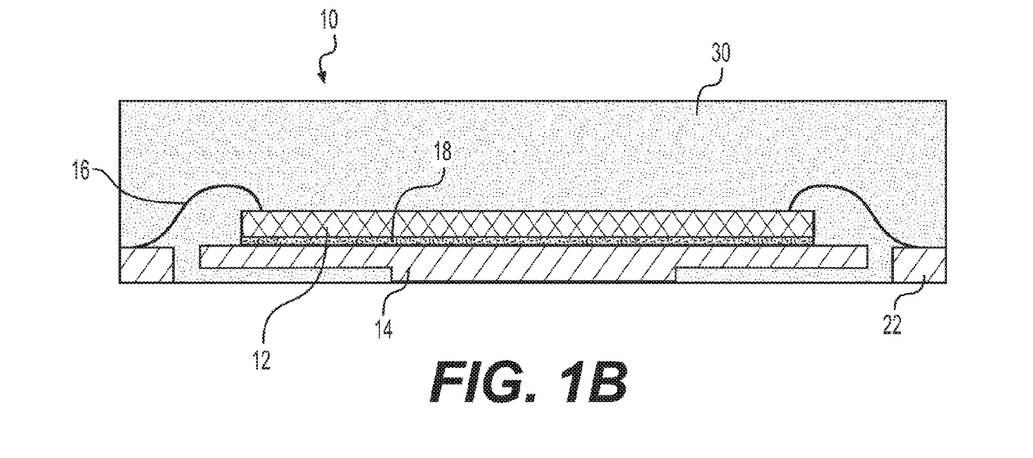
FIG. 1B is a schematic cross-sectional view of the IC package of FIG. 1A.

FIGS. 1A and 1B illustrate an exemplary IC package 10 of the current disclosure. FIG. 1A illustrates a cut-away perspective view of the package 10, and FIG. 1B illustrates its cross-sectional view. In the discussion that follows, reference will be made to both FIGS. 1A and 1B. Package 10 includes an IC die 12 attached to a die pad 14 of a lead frame 20. The IC die 10 may include one or more magnetically sensitive circuits formed thereon. These circuits may be sensitive to external magnetic fields. For example, the die 10 may be a magnetoresistive memory device having an array of magnetic memory cells, such as an MRAIVI chip having an array of spin torque and/or magnetic tunnel junction ("MTJ") bits (not shown). The magnetoresistive devices (e.g., ST-MRAM) may be magnetic tunnel barrier stacks/structures having, for example, perpendicular or in-plane anisotropy.

The die 12 may be attached or otherwise secured to the die pad 14 by any known method. In some embodiments, an adhesive die attach 18 may be used to attach a back side (i.e., a surface of the die 12 opposite the front side where integrated circuits are formed by IC fabrication techniques) of the die 12 to a surface of the die pad 14. In some embodiments, a die attach film (DAF) may be used to attach the die 12 to the die pad 14. A plurality of interconnects 16 (e.g., wires) may connect electrical contacts (or terminals) of the die 12 to leads 22 of the lead frame 20. Any suitable technique (e.g., a wire bonding, tape automated bonding (TAB), etc.) may be used to electrically connect the die 12 to the leads 22. Typical wire bonding techniques employ some combination of heat, pressure, and/or ultrasonic energy to make a weld. The die 12 and the lead frame 20 may then be encased or encapsulated with a molding compound 30 using a molding process.

Molding compound 30 may be magnetically conductive and electrically insulating, and may be formed from any suitable material. In some embodiments, molding compound 30 may be made of a composite material. As is known to those of ordinary skill in the art, a composite material (also called a composite) is a material made from two or more constituent materials, and may have properties that are significantly different from its constituent materials. FIGS. 2A-2D are simplified schematic illustrations of a few exemplary embodiments of molding compound 30. As illustrated in FIGS. 2A-2D, in some embodiments, the molding compound 30 may be a composite material having a filler material 32 embedded or otherwise disposed in a molding medium 34 (e.g., polymer, epoxy, plastic, etc.). The filler material 32 may include a ferromagnetic material having a high magnetic permeability. Magnetic permeability is a measure of the ability of a material to support the formation of a magnetic field within itself. It is the degree of magnetization that a material obtains in response to an applied magnetic field. In general, any ferromagnetic material may be used as the filler material 32, and any electrically non-conductive polymeric material may be used as the molding medium 34. In some embodiments, one or more of nickel (Ni), iron (Fe), molybdenum (Mo), mu-metal, supermalloy, etc. may be used as the filler material 32, and an epoxy resin containing one or more of additives (e.g., inorganic fillers, catalysts, flame retardants, stress modifiers, adhesion promoters, etc.) may be used as the molding medium 34.

In some embodiments, the filler material 32 may include nickel (Ni) (e.g., about 80% nickel (Ni)). In another embodiment, in lieu of nickel (Ni), or in addition to nickel (Ni), the filler material 32 may include iron (Fe) (e.g., about 15% iron (Fe)). In yet another embodiment, the filler material 32 may include molybdenum (Mo) (e.g., about 5% molybdenum (Mo)). In some embodiments, the filler material 32 may include an alloy of nickel (Ni) and iron (Fe) (along with other constituents), where the nickel (Ni) content is greater than or equal to about 80%. In some embodiments, a high magnetic permeability alloy material, such as mu-metal (any known formulation of mu-metal (e.g., 77% nickel (Ni), 16% iron (Fe), 5% copper (Cu) and 2% Chromium (Cr) or molybdenum (Mo); 80% nickel (Ni), 5% molybdenum (Mo), 12-15% iron (Fe), and small amounts of impurities), a commercially available mu-metal alloy (e.g., MuMETAL®, Mumetal1®, Mumetal2®, etc.), or supermalloy (75% nickel (Ni), 20% iron (Fe), and 5% molybdenum (Mo)) may be used as the filler material 32.

In general, the filler material 32 may have any concentration and distribution in the molding medium 34. Typically, the concentration and distribution of the filler material 32 in the molding medium 34 may depend upon the application. As shown in FIGS. 2A-2D, filler material 32 may be distributed in molding medium 34 in a substantial random orientation, substantial uniform orientation, and/or a partially random and partially uniform orientation. In some embodiments, the concentration and distribution of the filler material 32 in the molding medium 34 may be based on the desired properties (e.g., magnetic permeability, electrical conductivity/resistivity, thermal, molding properties, etc.) of the resulting molding compound 30. In some embodiments, the concentration of the filler material 32 may be different in different areas of the package 10. For example, in some embodiments, the concentration of the filler material 32 may be higher near the active side (top side with the integrated circuits) of the die 12 as compared to other regions (e.g., near the interconnects 16 and/or proximate the narrow cavities under die pad 14, etc.) of the package 10.

Figure 2A:
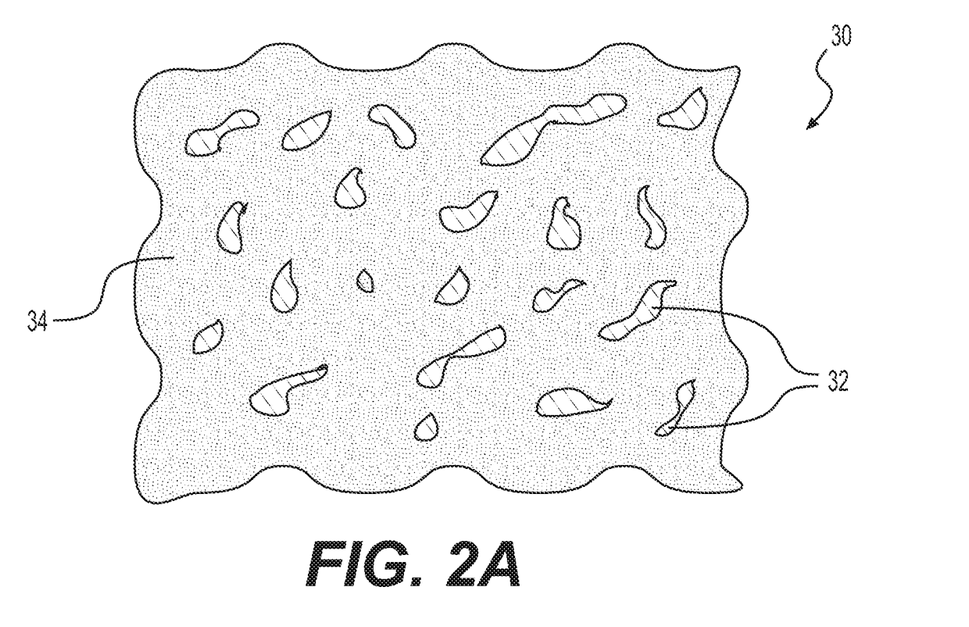
FIGS. 2A-2D are simplified schematic cross-sectional views of exemplary magnetically conductive compounds used in the IC package of FIG. 1.

The filler material 32 may have any shape and size and may be embedded in the molding medium 34 by any method. For example, in some embodiments, filler material 32 (e.g., in the form of a particles, balls, filaments, fibers, etc.) may be mixed with molding medium 34 in fluid state to form a slurry of molding compound 30. As illustrated in FIG. 2A, in some embodiments of molding compound 30, the particles of filler material 32 in the molding medium 34 may have a random (or non-uniform) shape/configuration and may have a random orientation. For example, as illustrated in FIG. 2A, some of the filler material 32 in the molding compound 30 may have a short and irregular configuration while other filler material 32 may resemble longer strands (or filaments) with uniform configuration, and these differently shaped particles may be oriented randomly (i.e., the orientation of the filler material 32 do not follow a pattern).

Figure 2B:
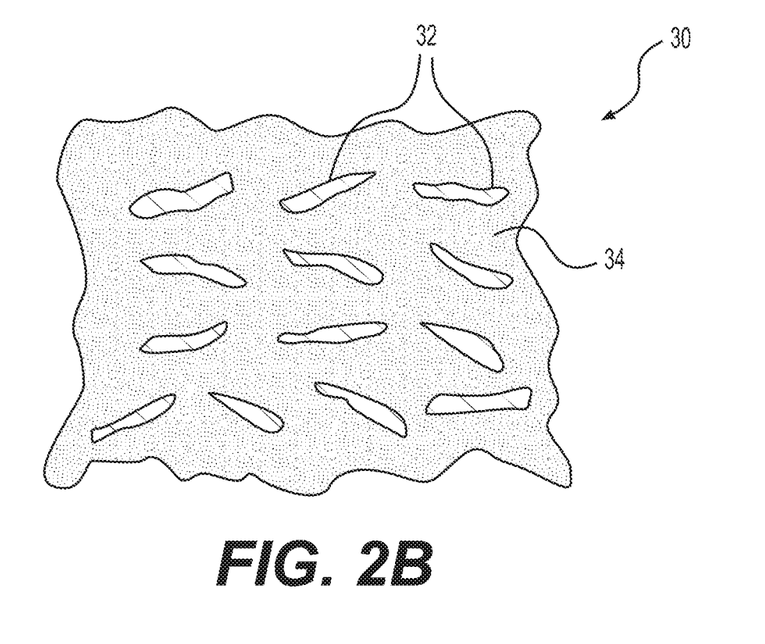
Figure 2C:
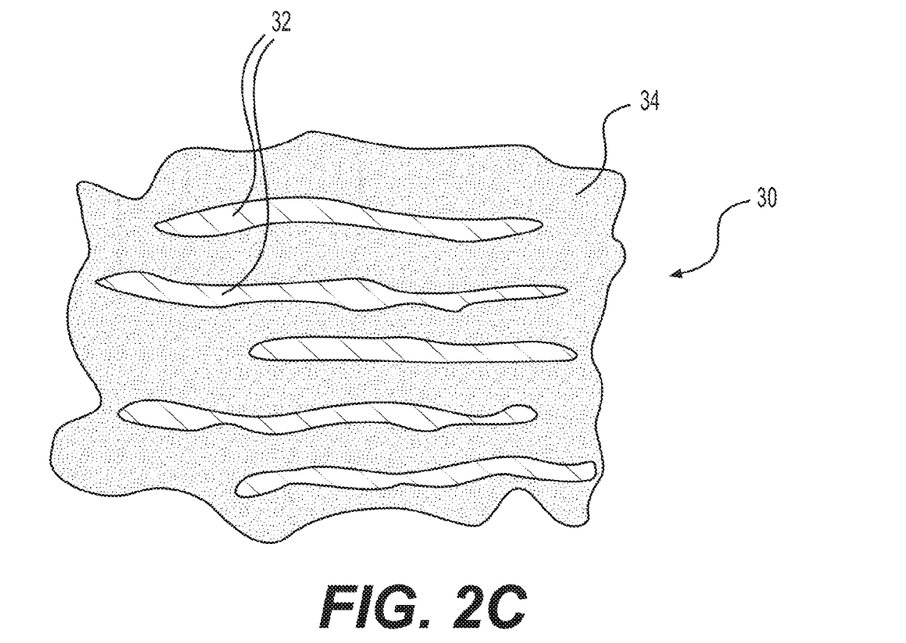
Figure 2D:
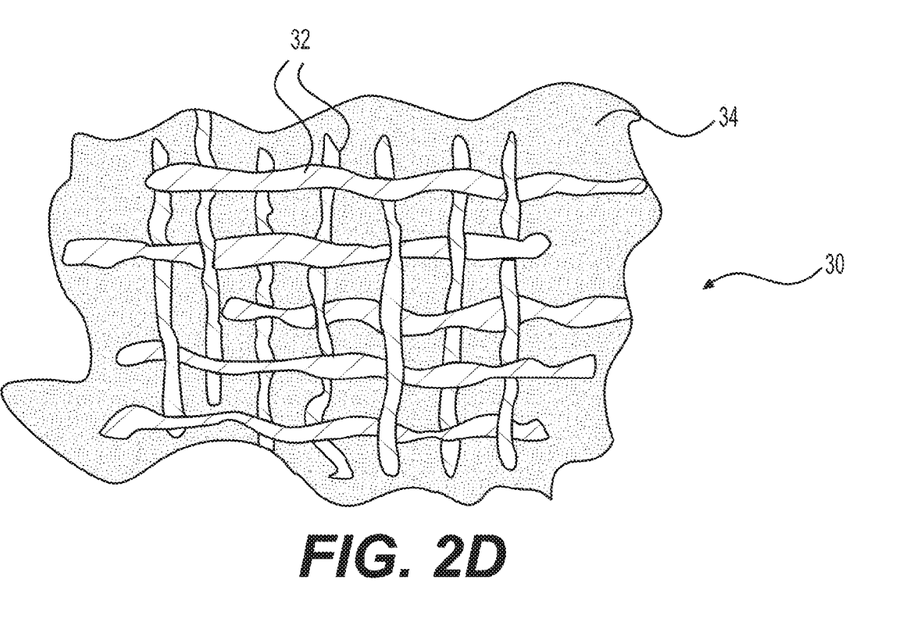

In some embodiments, the filler material 32 in the molding compound 30 may have a substantially similar shape. For example, FIGS. 2B-2D illustrate exemplary embodiments of molding compounds 30 where the filler material 32 in each molding compound 30 includes particles having a substantially similar or otherwise uniform shape. For example, the filler material 32 in the molding compound 30 illustrated in FIG. 2A may be elongate strands having substantially similar lengths (e.g., between about 1 mm-2 mm). Likewise, the filler material 32 in the molding compounds 30 of FIGS. 2C-2D may be similarly shaped strands or filaments with substantially similar, shorter, or otherwise longer lengths.

In some embodiments of molding compounds, as illustrated in FIGS. 2B-2D, the filler material 32 may be oriented in a particular direction or manner. For example, in the embodiments of FIGS. 2B and 2C, particles of filler material 32 are generally oriented along a horizontal axis (with respect to these figures), and in the embodiment of FIG. 2D, some of the particles (e.g., filaments or strands) of filler material 32 are oriented along a first direction and the other particles (e.g., filaments or strands) are oriented along a second direction orthogonal or perpendicular to the first direction, so as to resemble, e.g., a mesh or a grid pattern. It is contemplated that molding compounds with similarly oriented particles of filler material 32 may provide increased magnetic shielding. Although the filament shaped filler material 32 of FIGS. 2C and 2D may have any length, in some embodiments, the length of these filaments may be substantially similar to the length of the die 12.

In some embodiments, the external surfaces of particles of filler material 32 may include one or more layers of an insulating coating (such as, for example, an oxide coating) to, e.g., isolate each of the particles from one another. For example, particles of the filler material 32 may include an oxidized layer (or any other suitable insulating layer) to make the particles electrically non-conductive. These coatings may be formed by any suitable process known in the art (e.g., deposition, dipping, painting, chemical conversion, etc.). Since processes to form a coating on particles of filler materials 32 are well known in the art, they are not discussed further herein.

The molding compound 30 (of FIGS. 2A-2D) may be used to encapsulate the package 10, including, e.g., the die 12 and portions of the lead frame 20, by any known process (such as, e.g., a transfer molding process). In some embodiments, the encapsulated package may be subject to a curing process to solidify the molding compound 30. Since suitable molding processes are well known in the art, they are not described extensively herein. In some embodiments, the concentration and distribution of the filler material 32 in the molding medium 34 may be selected to achieve desired magnetic and/or electrical properties (high permeability, high electrical resistivity, etc.) while retaining sufficient flow properties (to prevent undesirable effects such as wire sweep (e.g., interconnects 16 being forced together) and voids resulting from an incomplete fill (e.g., in narrow cavities of the package 10).

The molding compound 30 may provide any desired shielding for the die 12 from external electromagnetic fields. In general, the molding compound 30 may be configured to produce any desired attenuation in electromagnetic fields by a suitable selection of, e.g., material and/or form of filler material 32, concentration of filler material 32 in the molding medium 34, distribution of filler material 32 in molding medium 34, layout and/or geometry of molding compound 30 on or within package 10, etc. In some embodiments, the molding compound 30 may be configured to provide a reduction in electromagnetic field of approximately 60 decibels (dB). However, it should be noted that this value is only exemplary. That is, a greater or lesser reduction in electromagnetic field may be achieved when using molding compound 30 to provide shielding from external electromagnetic fields.

Although FIGS. 1A and 1B illustrate the molding compound 30 as encasing or encapsulating substantially the entire package 10, this is only exemplary. In some embodiments, the molding compound 30 may only be applied to selected regions (of the package) to provide shielding to desired regions (e.g., die 12) of the package 10. For example, in some embodiments, the molding compound 30 may be applied to, or adjacent to, only the top surface of the die 12 (to form, e.g., a top magnetic shield) to selectively shield the circuits on the top surface of the die 12 from electromagnetic interference. In some embodiments, the molding compound 30 may only be applied to, or adjacent to, the bottom side of the die 12 or die pad 14 to act as a bottom magnetic shield. Similarly, the molding compound 30 may be selectively applied on or adjacent to any surface of the die 12. It is also contemplated that, in some embodiments, the molding compound 30 may only be applied to selected areas on or adjacent one or more surfaces (e.g., top surface, bottom surface, etc.) of the die 12 to shield these areas from external magnetic fields.

Figure 3A:
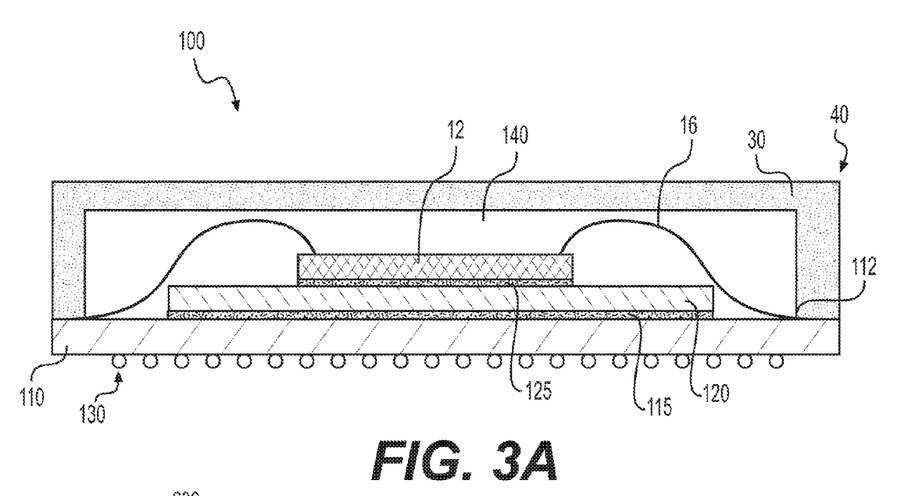
FIG. 3A illustrates a cross-sectional view of an exemplary IC package of the current disclosure.

FIG. 3A illustrates a cross-sectional view of another embodiment of a package 100. Package 100 includes an IC die 12 wire bonded to a substrate 110 using interconnects 16. As described with reference to the embodiment of FIGS. 1A and 1B, the top side of the die 12 may include circuits that are sensitive to external magnetic fields. The interconnects 16 (e.g., wires) may connect contacts (or terminals) of the die 12 to corresponding contacts 112 on the top surface of the substrate 110. As known in the art, electrical signals between the circuits on the die 12 and contacts 112 on the substrate 110 are transferred through the interconnects 16. Although not a requirement, in some embodiments, the contacts on the die 12 may be positioned along one or more edges of the die 12, and the contacts 112 on the substrate 110 may be positioned along one or more edges of the substrate 110. The substrate 110 may include signal paths (not shown) (e.g., conductive lines, through-hole vias, etc.) that transfer signals from the contacts 112 of the substrate 110 to a ball grid array (BGA) 130 on the bottom side of the substrate. BGA is a surface mount technology where small electrically conductive solder balls are used to attach the package 100 to a motherboard (or another interconnecting layer). These solder balls transfer the signals to and from the die 12 to the motherboard. Although FIG. 3A illustrates a BGA 130 on the back side of the substrate, this is only exemplary. In general, any known method (e.g., pin grid array, land grid array, etc.) may be used to attach the package 100 to the motherboard.

The die 12 may be attached to the substrate 110 via a bottom shield 120. In some embodiments, as illustrated in FIG. 3A. The back side of the die 12 may be attached to one side of the bottom shield 120, and the opposite side of the bottom shield 120 may be attached to the top side of the substrate 110. In some embodiments, a first adhesive 125 (e.g., die attach film, epoxy adhesive, etc.) may be used to attach the die 12 to the bottom shield 120 and a second adhesive 115 may be used to attach the bottom shield 120 to the substrate 110. In general, any type of adhesive may be used as the first and second adhesives 125, 115. The first and second adhesives 125, 115 may be the same or different materials. In one embodiment, one or both of the first and second adhesives 125, 115 may be an electrically non-conductive epoxy or paste and/or an adhesive film. In embodiments where the adhesive is an epoxy, the epoxy may be dispensed between the adherents in any manner (e.g., screen printed, needle deposited, etc.). In some embodiments, one or more of the first and second adhesives 125, 115 may be a B-Stage DAF tape and/or a direct epoxy die attach, or any suitable combination thereof.

The bottom shield 120 may shield the die 12 from external magnetic fields. In some embodiments, bottom shield 120 may be a metallic shield, formed of a ferromagnetic metal having a relatively high magnetic permeability. Any of the materials described with reference to the filler material 32 of package 10 (e.g., iron-nickel alloy, mu-metal, supermalloy, etc.) may be used to fabricate bottom shield 120. In some embodiments, a high permeability metal in sheet, plate, or foil format may be fabricated into the bottom shield 120 of desired dimensions by any known mechanical (e.g., stamping, machining, etc.) or chemical (e.g., photolithography and etching) process. It is also contemplated that, in some embodiments, the bottom shield 120 may be made of a composite material (e.g., the same as, or similar to, molding compound 30). In some such embodiments, a bottom shield 120 of the desired dimensions may be molded (e.g., in a mold) using the molding compound 30.

The top side of the die 12 may also include a top shield to protect the die 12 from external magnetic fields. In some embodiments, the top side shield may be formed of the molding compound 30. In some embodiments, as illustrated in FIG. 3A, the top side shield (made of molding compound 30) may resemble a lid 40 that fits on, above, or over the top side of the substrate 110 to form an isolating cavity 140 around the die 12. Although any suitable process can be used to form the lid 40, in some embodiments, the molding compound 30 may be injected (or molded) around the die 12 in the form of the lid 40 that encloses the die 12 within the isolating cavity 140. In some embodiments, a preformed lid 40 (e.g., made of cured molding compound 30) may be attached to the top surface of the substrate 110 using an adhesive material (not shown). That is, the lid 40 having the desired shape and dimensions may be previously formed by any known process (e.g., molding), and this preformed lid 40 may be attached to the substrate 110 to enclose the die 12 within the isolating cavity 140.

Although FIG. 3A illustrates the contacts 112 of the substrate 110 as being positioned inside lid 40 (i.e., located in the isolating cavity 140), this is only exemplary. In some embodiments, the contacts 112 may be covered by the molding compound 30 (see FIG. 4A), or may be positioned outside the lid 40. If the contacts 112 are positioned inside the lid 40, the interconnects 16 will be completely positioned in the isolating cavity 140. If, however, the contacts 112 are positioned outside the lid 40, the interconnects 16 may pass through the molding compound 30. It should be noted that, although the die 12 is illustrated as being wire bonded to the substrate 110, this is not a requirement. Any known interconnecting method (e.g., c4, tab, etc.) may be used to connect the die 12 to the substrate 110.

The isolating cavity 140 around the die 12 may be filled with air (as illustrated in FIG. 3A) or another material. Any type of material (e.g., gaseous, liquid, solid, etc.) may be used to fill the isolating cavity 140. In some embodiments, this material may completely fill the cavity 140, while in other embodiments, the material may only partially fill the cavity 140. In some embodiments, this cavity filling material may include an electrically insulating compound.

An exemplary method of making package 100 will now be described. For the sake of brevity, steps that are well known in the art will not be described herein. One side of the bottom shield 120 may be attached to the top side of the substrate 110 using adhesive 115, and the opposite side of the bottom shield 120 may be attached to the back side of the die 12 using adhesive 125. In some embodiments, the mating sides of the die 12, the bottom shield 120, and/or the substrate 110 may be provided (e.g., deposited, coated, etc.) with one or more layers of interfacial materials (e.g., barrier layers, insulating layers, adhesion promoters, etc.) before they are attached together. Thus, in some embodiments, the die 12 may be electrically insulated from the bottom shield 120. Interconnects 16 may then be formed between the contacts of the die 12 and the contacts 112 of the substrate 110. Any known process (e.g., wire bonding) may be used to form the interconnects 16. The lid 40 (e.g., made of coating material 30) may then be formed on (by, e.g., injection molding, transfer molding, etc.), or a preformed lid 40 attached to, the top side of the substrate 110 to enclose the die 12 within the isolating cavity 140. In some embodiments, the die 12, the interconnects 16, and/or the substrate 110 (including, e.g., bonding pads on the substrate) may be coated with an insulating material prior to forming the lid 40. The insulating material may protect the package from electrical shorts that may result from the lid forming process (e.g., as a result of wire sweep). After the lid 40 is formed, other standard fabrication processes may occur. For example, the packages may be subjected to a finishing process and, in some cases, may be singulated to form individual packages. The packages may also be subjected to testing (e.g., burn-in tests, electrical tests, etc.), marking, and inspection. Since these steps are well known in the art, they are not discussed herein.

In embodiments where the isolating cavity 140 is filled with an insulating compound (e.g., an electrically insulating material) or another suitable material, the insulating compound (or other material) may be disposed (e.g., by injection molding, transfer molding, etc.) around the die 12 prior to forming the lid 40. However, it is also contemplated that, in some embodiments, the insulating compound may be disposed (e.g., by injecting through a hole in the lid 40 or the substrate 110) into the isolating cavity 140 after the lid 40 is formed. Although the insulating compound is described as filling the isolating cavity 140, completely filling of the cavity 140 is not a requirement. That is, in some embodiments, the insulating compound may partially fill the isolating cavity 140. That is, the isolating cavity 140 may be filled partially with the insulating compound (e.g., blanketing the die 12 and the top surface of the substrate 110) and the remaining space may be filled with air or another material. It is also contemplated that, in some embodiments, the isolating cavity 140 may include, or may be filled with, multiple materials to impart desirable characteristics to the package 100.

Figure 3B:
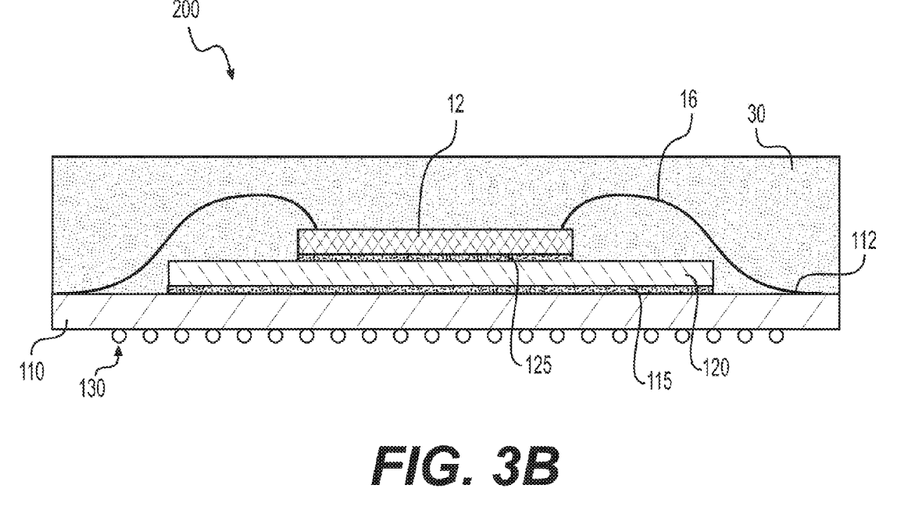
FIG. 3B illustrates a cross-sectional view of another exemplary IC package of the current disclosure.

In some embodiments, the isolating cavity 140 of package 100 may be eliminated, and the molding compound 30 may completely fill this space. FIG. 3B illustrates a package 200 where the molding compound 30 forms an over-mold over the top surface of the package. For the sake of brevity, aspects of package 200 that are similar to package 100 (of FIG. 3A) are not described again. To form package 200, after the contacts of die 12 are wire bonded using interconnects 16 (or connected together using another known interconnect technology), the molding compound 30 is disposed (using, e.g., injection molding, transfer molding, etc.) over the top surface of the die 12 and the substrate 110 to form an overmolded package 200. The molding compound 30 may form a top surface shield and the bottom shield 120 may form a bottom surface shield to protect package 200 from external magnetic fields. As shown in FIG. 3B, the molding compound 30 of package 200 may completely encapsulate die 12, bottom shield 120, a top side of substrate 110, interconnects 16, and/or contacts 112.

Figure 4A:
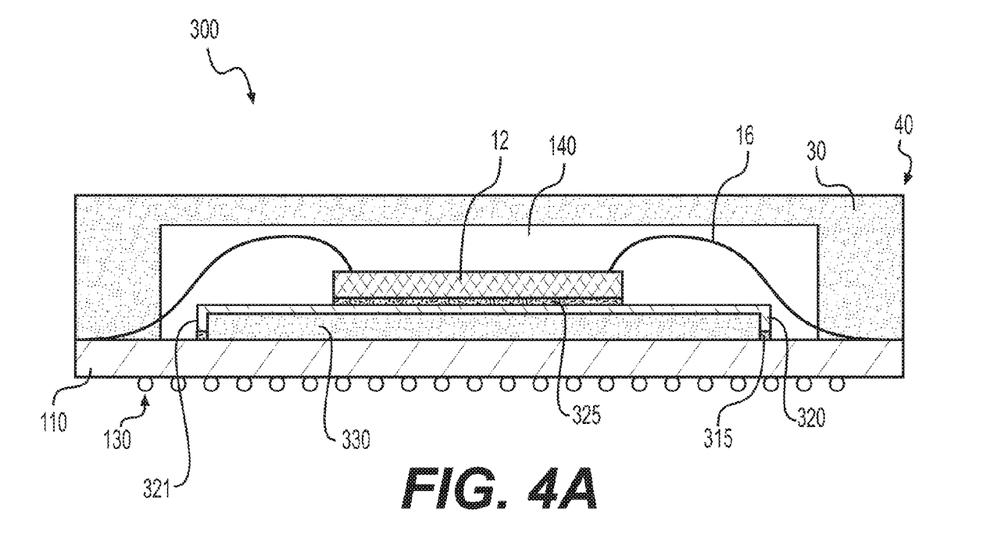
FIG. 4A illustrates a cross-sectional view of a further exemplary IC package of the current disclosure.

FIG. 4A illustrates another exemplary embodiment of a package 300 of the present disclosure. Package 300 may be similar to package 100 (of FIG. 3A) in structure except that the bottom shield 120 of package 100 may be replaced with a spacer 320. The spacer 320 may be attached to the top surface of the substrate 110 with an adhesive 315 to define a volume between the spacer 320 and the substrate 110. This volume may be filled with a magnetically conductive and electrically insulating material in the form of a molding compound 330. Molding compound 330 may be the same as, or different from, molding compound 30 of package 100. Similar to molding compound 30, molding compound 330 may be a composite material that includes a ferromagnetic filler material having a high magnetic permeability embedded in an electrically nonconductive molding medium. The filler material and molding medium of molding compound 330 may include any of the materials described with reference to filler material 32 and molding medium 34 of molding compound 30.

Figure 5A:
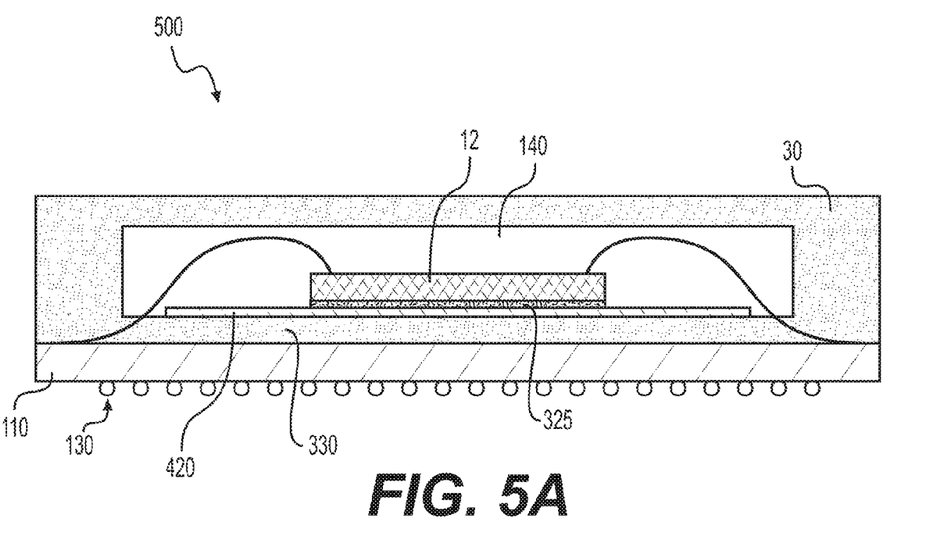
FIG. 5A illustrates a cross-sectional view of another exemplary IC package of the current disclosure.

Spacer 320 may be made of any suitable material. In some embodiments, spacer 320 may be made of an electrically insulating material. For example, spacer 320 may be made of an insulating plastic. However, it is also contemplated that other materials (e.g., ceramics, etc.) may be used to fabricate spacer 320. In some embodiments, spacer 320 may be made of a metal and coated with other materials (e.g., insulating materials) to impart desirable properties to spacer 320. Spacer 320 may have any shape (e.g., lid-like or cap-like shape as illustrated in FIG. 4A, a flat plate-like shape as illustrated in FIG. 5A, or another shape) and may be formed in any manner.

The spacer 320 may be attached or otherwise secured to the substrate 110 using adhesive 315, so as to define a cavity between a top surface of substrate 110 and spacer 320. A bottom surface of the die 12 may be attached to a top surface of spacer 320 using adhesive 325. Adhesives 315 and 325 may include any known adhesives. In some embodiments, adhesives 315 and 325 may be similar to, or the same as, adhesives 115 and 125 of package 100. The molding compound 330 may be filled in the cavity of the spacer 320 before, or after, the spacer 320 is attached to the substrate 110. In embodiments where the molding compound 330 is filled in the cavity after the spacer 320 is attached, a molding process (e.g., injection molding, transfer molding, etc.) may be used to fill the space between the spacer 320 and the substrate 110 with the molding compound 330. In some embodiments, the spacer 320 (and/or substrate 110) may include features (such as holes) to assist in the filling of the cavity. The molding compound 330 disposed between spacer 320 and substrate 110 may act as a bottom shield to protect the die 12 from external electromagnetic fields.

Figure 4B:
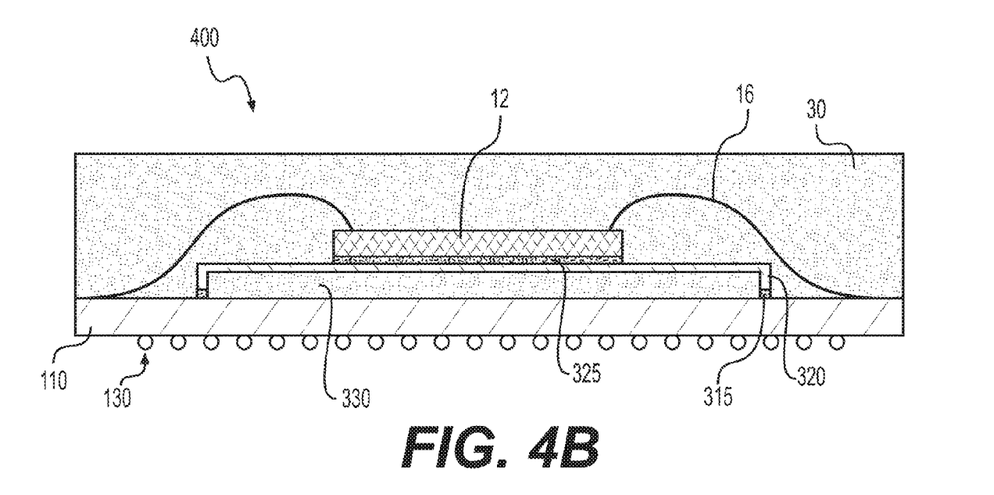
FIG. 4B illustrates a cross-sectional view of yet another exemplary IC package of the current disclosure.

As explained with reference to package 100 (of FIG. 3A), the top surface of the substrate 110 may also include a shield in the form of a lid 40 made of molding compound 30. Although FIG. 4A illustrates an isolating cavity 140 (within which die 12 resides) between the lid 40 and the top surface of the substrate 110, this is only exemplary. As described with reference to package 200 (of FIG. 3B), in some embodiments, the isolating cavity 140 may be eliminated. FIG. 4B illustrates an embodiment of a package 400 where the molding compound 30 encapsulates the die 12 and the top surface of the substrate 110 to form an overmolded package 400. As described with reference to package 200 (of FIG. 3B), after the contacts of die 12 are wire bonded to the substrate 110, the molding compound 30 may be used to encapsulate the die 12 and top surface of the substrate 110 to form package 400. The molding compound 30 may form a top magnetic shield and molding compound 330 may form a bottom magnetic shield to protect die 12 from external magnetic fields.

An exemplary method of making packages 300, 400 will now be described. The spacer 320 may be attached to the top side of the substrate 110 using an adhesive 315 to define a cavity (or volume) between the spacer 320 and the substrate 110. This cavity may then be filled with molding compound 330 and cured. Any known process may be used to fill the cavity. In some embodiments, the molding compound 330 may be introduced (e.g., injected) into the cavity through a hole formed on or in the spacer 320 or substrate 110. In some embodiments, the molding compound 330 may be disposed on the spacer 320 (e.g., in a recess of the spacer 320 that defines the volume after attachment to the substrate 110) prior to attachment of the spacer 320 to the substrate 110. The back side of the die 12 may then be attached to the spacer 320 using an adhesive 325, and the contacts of the die and the substrate 110 may be wire bonded together using the interconnects 16. In some embodiments, the die 12 may be attached to the spacer 320 before the spacer 320 is attached to the substrate 110. The molding compound 30 may then be disposed over or on the top surface of the substrate 110 using any known process (e.g., injection molding, transfer molding, etc.).

To fabricate package 300, the molding compound 30 will be disposed such that it forms a lid 40 that defines an isolating cavity 140 above the die 12. In some embodiments, a preformed lid 40 (made of molding compound 30) may be attached or otherwise secured to the top side of the substrate 110 using an adhesive to define the isolating cavity 140. As discussed with reference to package 100, in some embodiments, the isolating cavity 140 may be filled with one or more materials (e.g., insulating materials or molding compound 30) after attachment of the lid 40 to the substrate 110. To fabricate package 400 (of FIG. 4B), the molding compound 30 may be disposed such that the die 12 and top surface of the substrate 110 are encapsulated by the molding compound 30. In some embodiments, the top side of die 12 and the substrate 110 may be coated with an insulating material before the molding compound 30 is provided.

Although not illustrated, the embodiments of FIGS. 4A and 4B may employ a top magnetic shield (not shown) in addition to molding compound 330 between spacer 320 and substrate 110 providing a bottom magnetic shield. The top magnetic shield may be a metallic shield, formed of a ferromagnetic metal having a relatively high magnetic permeability. Moreover, the top magnetic shield may include one or more of the features described above in connection with bottom shield 120 of FIGS. 3A and 3B.

Figure 5B:
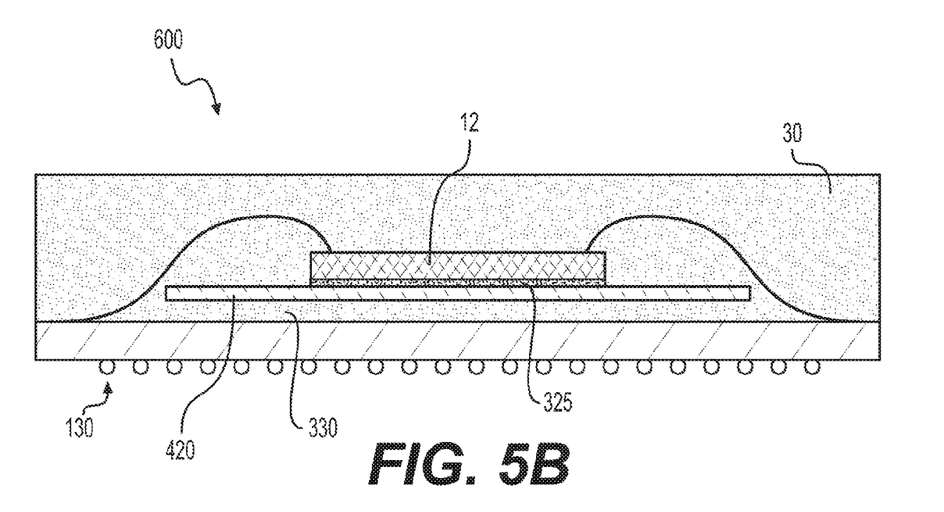
FIG. 5B illustrates a cross-sectional view of a further exemplary IC package of the current disclosure.

Although FIGS. 4A and 4B illustrate embodiments of packages where the spacer 320 has a cap-like shape to define a recess that opens only to the substrate 110 for holding therein molding compound 330, this is not a requirement. FIGS. 5A and 5B illustrate exemplary packages 500, 600 with a plate-like spacer 420. The spacer 420 may be made of the same, or similar, materials as those described with reference to spacer 320. The spacer 420 may be positioned over substrate 110 such that a layer of molding compound 330 is positioned between the spacer 420 and the substrate 110. Although not illustrated, in some embodiments, an adhesive may attach the layer of molding compound 330 to one or both of the substrate 110 and the spacer 420. In packages 500 and 600, the layer of molding compound 330 may form a bottom shield for the die 12. In package 500 (of FIG. 5A), the molding compound 30 is disposed on the top surface of the substrate 110 to define an isolating cavity 140 around the die 12. As discussed with reference to packages 100 and 300 (of FIGS. 3A and 4A), the isolating cavity 140 may be filled with air or one or more other materials. In package 600 (of FIG. 5B), the top surface molding compound 30 is disposed such that the molding compound 30 encapsulates the die 12, thereby eliminating the isolating cavity 140 of, e.g., FIG. 5A. In both packages 500 and 600, the molding compound 30 forms a top shield for the die 12 and molding compound 330 forms a bottom surface shield for the die 12. Further, in both packages 500 and 600, molding compound 330, which forms the bottom shield, and molding compound 30, which forms the top shield, join together (or are in electrical contact) to form a faraday cage-like shielding structure for the die 12. Stated differently, molding compounds 30 and 330 may be in electrical contact to form a grounded metal screen or enclosure around die 12 to exclude external electrostatic and electromagnetic influences.

An exemplary method of making packages 500, 600 will now be described. A layer of molding compound 330 may be disposed (e.g., deposited, transfer molded, injected, etc.) on the top surface of the substrate 110 and/or the bottom surface of the spacer 420. The spacer 420 then may be positioned over substrate 110 with the layer of molding compound 330 positioned in between spacer 420 and substrate 110. In some instances, the spacer 420 may be positioned over substrate 110 prior to molding compound being provided between the spacer 420 and substrate 110. In some embodiments, the stickiness of the molding compound 330 prior to curing may assist in attaching or otherwise securing the spacer 420 to the substrate 110. In some embodiments, an adhesive may be used to attach or otherwise secure the spacer 420 to the substrate 110. The die 12 may then be attached to the spacer 420 using an adhesive 325, and the interconnects 16 may be wire bonded between the contacts of the die 12 and the substrate 110. As discussed with reference to the embodiments of FIGS. 4A and 4B, in some embodiments, the die 12 may be attached to the spacer 420 before the spacer 420 is attached to the substrate 110. The molding compound 30 may then be disposed on the top surface of the substrate 110 in a manner similar to that discussed with reference to FIGS. 4A and 4B. The disposed molding compound 30 may electrically contact the molding compound 330 to form a faraday cage-like structure to shield the die 12, as explained above.

Figure 6A:
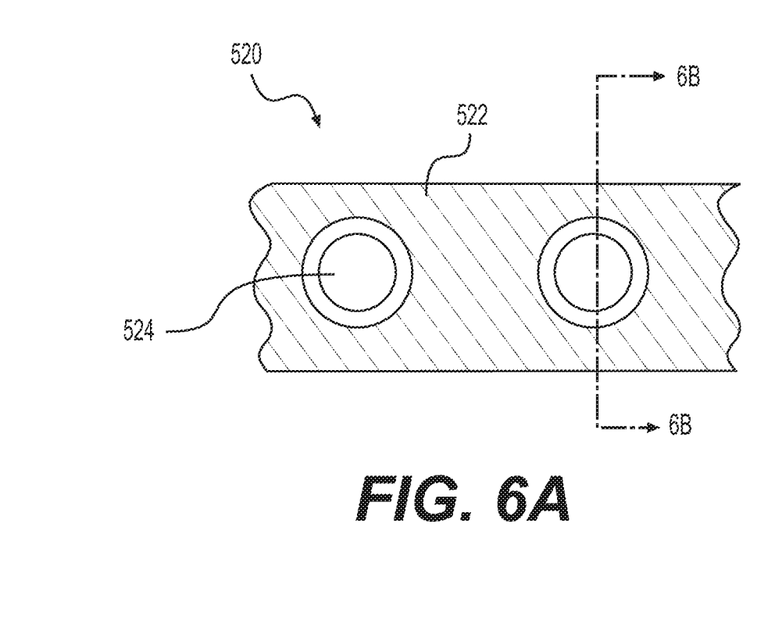
FIG. 6A illustrates a cross-sectional view of a portion of an exemplary spacer used in an IC package of the current disclosure.
Figure 6B:
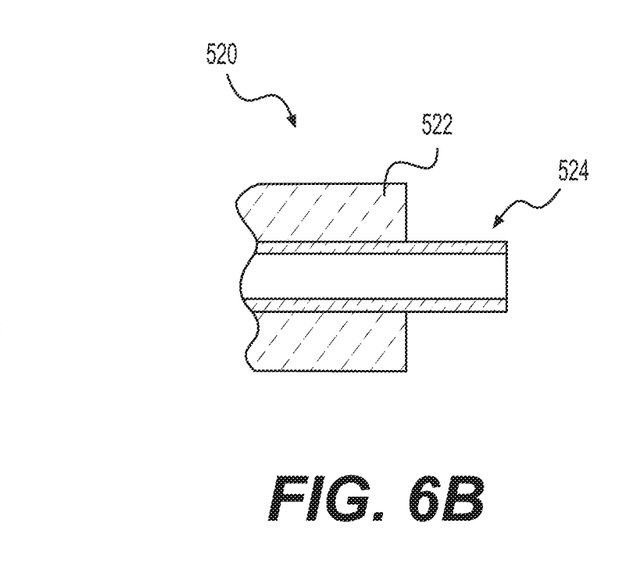
FIG. 6B illustrates another cross-sectional view of a portion of an exemplary spacer of FIG. 6A.

In some embodiments, spacer 320 (of FIGS. 4A and 4B) may include features to assist in the flow of the molding compound 330. FIGS. 6A and 6B are cross-sectional views (along two mutually perpendicular directions transverse to the active surface of the die 12) of a portion of a wall 522 of an exemplary spacer 520. The wall 522 may be any part (e.g., a part that extends horizontally or vertically with respect to the active surface of the die 12) of the spacer 520. For example, wall 522 may correspond to wall 321 of spacer 320 depicted in FIG. 4A. As illustrated in FIG. 6, the wall 522 may include through-holes 524 that form tunnel-like structures through the wall 522. These through-holes 524 may allow the molding compound 330 (or molding compound 30) to extrude therethrough to more effectively shield the die 12 and to permit electrical contact between molding compounds 30 and 330. As those of ordinary skill will readily recognize, through-holes 524 may allow molding compound 30 to flow between spacer 320 and substrate 110 to become molding compound 330. More specifically, the through-holes 524 may assist in filling the cavity formed under the spacer 320 (of FIGS. 4A and 4B) with molding compound. As also shown in FIG. 6B, a portion of through-hole 524 may extend away from a surface of wall 522.

Although various embodiments of the present disclosure have been illustrated and described in detail, it will be readily apparent to those skilled in the art that various modifications may be made without departing from the present disclosure or from the scope of the appended claims.

I claim:

1. An integrated circuit package, comprising:
   an integrated circuit die including a first side and a second side opposite the first side, the first side including at least one magnetoresistive device formed thereon;
   a first magnetic shield disposed on or adjacent the first side of the integrated circuit die, wherein the first magnetic shield is formed of a composite material; and
   a second magnetic shield disposed on or adjacent the second side of the integrated circuit die,
   wherein the first magnetic shield includes at least one material different from the second magnetic shield.

2. The integrated circuit package of claim 1, wherein the composite material includes a plurality of ferromagnetic filler elements dispersed in an electrically nonconductive molding medium.

3. The integrated circuit package of claim 1, wherein the composite material includes a plurality of filler elements dispersed in an electrically nonconductive molding medium, and wherein each filler element of the plurality of filler elements includes nickel.

4. The integrated circuit package of claim 1, wherein the composite material includes a plurality of filler elements dispersed in an electrically nonconductive molding medium, and wherein each filler element of the plurality of filler elements includes an alloy of nickel and iron.

5. The integrated circuit package of claim 1, wherein the composite material includes a plurality of filler elements dispersed in an electrically nonconductive molding medium, wherein each filler element of the plurality of filler elements includes an alloy of nickel and iron, and wherein the alloy includes approximately 80% nickel.

6. The integrated circuit package of claim 1, wherein the second magnetic shield is made of metal.

7. The integrated circuit package of claim 1, wherein the first magnetic shield and the second magnetic shield are in electrical contact.

8. The integrated circuit package of claim 1, wherein the first magnetic shield encapsulates at least the first side of the integrated circuit die.

9. The integrated circuit package of claim 1, further including a substrate positioned adjacent the second side of the integrated circuit die, and wherein the second magnetic shield is disposed between the substrate and the integrated circuit die.

10. The integrated circuit package of claim 1, wherein the second magnetic shield is separated from the first magnetic shield by an electrically insulating spacer.

11. The integrated circuit package of claim 1, wherein an electrically insulating spacer is disposed between the first and second magnetic shields, and wherein the electrically insulating spacer includes at least one through opening.

12. The integrated circuit package of claim 1, wherein the integrated circuit die is disposed within an isolating cavity, and wherein the first magnetic shield surrounds the isolating cavity.

13. An integrated circuit package, comprising:
an integrated circuit die including a first side and a second side opposite the first side, the first side including at least one magnetoresistive device formed thereon;
a first magnetic shield disposed on or adjacent the first side of the integrated circuit die; and
a second magnetic shield disposed on or adjacent the second side of the integrated circuit die, wherein the first magnetic shield includes a composite material having a plurality of ferromagnetic filler elements dispersed in an electrically nonconductive molding medium, and wherein the first magnetic shield includes at least one material different from the second magnetic shield.

14. The integrated circuit package of claim 13, wherein each filler element of the plurality of filler elements includes nickel.

15. The integrated circuit package of claim 13, wherein each filler element of the plurality of filler elements includes an alloy of nickel and iron.

16. The integrated circuit package of claim 13, wherein each filler element of the plurality of filler elements includes an alloy of nickel and iron, and wherein the alloy includes approximately 80% nickel.

17. The integrated circuit package of claim 13, wherein the first magnetic shield and the second magnetic shield are in electrical contact.

18. The integrated circuit package of claim 13, further including a substrate positioned adjacent the second side of the integrated circuit die, and wherein the second magnetic shield is disposed between the substrate and the integrated circuit die.

19. The integrated circuit package of claim 13, wherein the first magnetic shield is electrically insulated from the second magnetic shield.

20. The integrated circuit package of claim 13, wherein the first magnetic shield is separated from the second magnetic shield by an electrically insulating spacer.

21. The integrated circuit package of claim 13, wherein the first magnetic shield is separated from the second magnetic shield by an electrically insulating spacer, and wherein the electrically insulating spacer includes at least one through opening.

22. The integrated circuit package of claim 13, wherein the integrated circuit die is disposed within an isolating cavity, and wherein the first magnetic shield surrounds the isolating cavity.

23. An integrated circuit package, comprising:
an integrated circuit die including a first side and a second side opposite the first side, the first side including at least one magnetoresistive device formed thereon;
a substrate positioned adjacent the second side of the integrated circuit die;
a first magnetic shield disposed on or adjacent the first side of the integrated circuit die, wherein the first magnetic shield is formed of a composite material; and
a second magnetic shield disposed on or adjacent the second side of the integrated circuit die,
wherein the second magnetic shield is different from the first magnetic shield, and wherein the second magnetic shield is disposed between the substrate and the integrated circuit die.

24. The integrated circuit package of claim 23, wherein the composite material includes a plurality of filler elements dispersed in an electrically nonconductive molding medium.

25. The integrated circuit package of claim 23, wherein the first magnetic shield encapsulates at least the first side of the integrated circuit die.

\* \* \* \* \*